United States Patent
Katakura

[11] Patent Number: 6,044,034
[45] Date of Patent: Mar. 28, 2000

[54] MULTIPORT MEMORY HAVING PLURALITY OF GROUPS OF BIT LINES

[75] Inventor: Hiroshi Katakura, Kawasaki, Japan

[73] Assignee: Fujitsu Limited, Kawasaki, Japan

[21] Appl. No.: 09/123,983

[22] Filed: Jul. 29, 1998

[30] Foreign Application Priority Data

Mar. 16, 1998 [JP] Japan .................................. 10-065095

[51] Int. Cl.⁷ ..................................................... G11C 8/00
[52] U.S. Cl. ................. 365/230.05; 365/65; 365/230.03; 365/145
[58] Field of Search ................................ 365/230.05, 65, 365/189.04, 230.03, 214, 145, 220, 210

[56] References Cited

U.S. PATENT DOCUMENTS

| | | | |
|---|---|---|---|
| 5,060,145 | 10/1991 | Scheuneman et al. | 365/230.03 |
| 5,289,431 | 2/1994 | Konishi | 365/230.03 |
| 5,323,349 | 6/1994 | Hamade et al. | 365/207 |
| 5,375,089 | 12/1994 | Lo | 365/189.05 |
| 5,493,536 | 2/1996 | Aoki | 365/230.05 |
| 5,940,316 | 8/1999 | Koike | 365/145 |

*Primary Examiner*—David Nelms
*Assistant Examiner*—Tuan T. Nguyen
*Attorney, Agent, or Firm*—Armstrong, Westerman, Hattori, McLeland, & Naughton

[57] ABSTRACT

Disclosed is a multiport memory capable of operating at a higher speed while minimizing the adverse effect of an adjoining bit line due to a parasitic capacitance. The multiport memory includes complementary write data lines and a read data line, wherein the read data line is sandwiched between the complementary write data lines. In a memory in which one port is a first port used exclusively for writing and the other port is a second port used exclusively for reading, and a group of bit lines includes complementary write data lines associated with the first port and a read data line associated with the second port, the complementary write data lines function as shield lines so as to minimize the adverse effect of noise upon the read data line. When the same column is accessed through the first port and second port, one of the potentials on the complementary write data lines is driven high and the other thereof is driven low. Adverse effects upon the read data line are therefore canceled out and thus minimized. In a memory having two groups of bit lines each including complementary write data lines and a read data line, the complementary write data lines belonging to each group are arranged to sandwich the read data line belonging to the same group. In this case, the write data lines and read data line belonging to the same group will not be used simultaneously. During reading, the potentials on the write data lines on both sides of the read data line are fixed to given values, and the write data lines on both sides of the read data line work as shield lines.

17 Claims, 12 Drawing Sheets

MULTIPORT MEMORY HAVING PLURALITY OF GROUPS OF BIT LINES

BACKGROUND OF THE INVENTION

1. Field of the Invention

The present invention relates to a multiport memory which includes a plurality of groups of bit lines, extending in the direction of a column within each memory cell, and which can access different memory cells in parallel.

2. Description of the Related Art

There is a semiconductor memory called a "multiport memory" which can access different memory cells in parallel. The method of accessing different memory cells in parallel can be a method in which there are two input ports for an address signal and an input/output port for a data signal and writing or/and reading can be performed on different memory cells in parallel, a method in which one and is used exclusively for writing and the other port is used exclusively for reading, and a method in which writing and reading can be carried out through one port, and the other port is used exclusively for reading. In the latter case, it is impossible to access the same memory cell concurrently. Moreover, there is a method in which one input port is provided for an address signal and reading written data items car be carried out in parallel with writing the data to the memory cell indicated by the address signal. In any of the modes, bit lines extending in the direction of a column within each memory cell are grouped into a plurality of independent subgroups.

However, such an array causes parasitic capacitance to develop between adjoining bit lines. Because the capacity of a multiport memory has grown in recent years, the capacitance of the parasitic capacitor has increased and the adverse effect thereof cannot be ignored any longer. The adverse effect becomes critical when memory cells on the same column are accessed in parallel through different ports. These accesses can cause a malfunction. Assuming that the operating speed of a memory is low, and that a sense amplifier is actuated for amplification after the potential on a read data line varies sufficiently due to reading of data from a memory cell, the adverse affect on an adjacent bit line (write data line or read data line) due to parasitic capacitance is so small as not to pose a problem. However, there is a demand for a multiport memory offering a high operating speed, or especially, a high reading speed. For improving the operating speed, the adverse effect of the parasitic capacitance cannot be ignored.

Moreover, in the conventional device, when a memory cell is constituted by a flip-flop (FF), the device is a volatile memory device whose stored data is lost when the power supply is turned off. A non-volatile multiport memory having memory cells accessible in parallel, a type offering a high operating speed and having a simple configuration is required.

SUMMARY OF THE INVENTION

The present invention attempts to solve the above problems. The first object of the present invention is to realize a multiport memory capable of operating at a higher speed while minimizing an adverse effect due to parasitic capacitances between adjoining bit lines. The second object of the present invention is to realize a non-volatile multiport memory offering a high operating speed and having a simple configuration.

A semiconductor memory according to the first aspect of the present invention includes complementary write data lines and a read data line. For accomplishing the first object, the read data line is sandwiched between the complementary write data lines.

The first aspect of the present invention can be implemented in a semiconductor memory having two ports, one of which is a first port used exclusively for writing and the other thereof is a second port used exclusively for reading, and including a group of bit lines composed of complementary write data lines associated with the first port and a read data line associated with the second port. In this case, the complementary wrote data lines function as shield lines so as to minimize the adverse effect of noise upon the read data line. For accessing the same column through the first port and second port, when data in a memory cell is read onto the read data line, the potentials on the complementary write data lines may vary at the same time. One of the potentials on the complementary write data lines is driven high, while the other thereof is driven low. The adverse effects upon the read data lines are therefore canceled out and thus minimized.

Moreover, the first aspect of the present invention can be implemented in a memory having two ports and two groups of bit lines each composed of complementary write data lines and a read data line. In this case, the complementary write data lines belonging to each group are arranged to sandwich the read data line belonging to the same group. In this case, the write data lines and read data line belonging to the same group will not be used simultaneously. When the potential on the read data line varies depending on data in an associated memory cell, the potentials on the write data lines on both sides of the read data line are fixed to, for example, a high level and low level respectively, or intermediate levels. The write data lines on both sides of the read data line function as shield lines, thus minimizing the adverse effect of noise upon the read data line. When the complementary write data lines and a read data line are provided for one port alone, the first aspect is implemented in the one port.

A semiconductor memory according to the second aspect of the present invention includes a group of bit lines subdivided into a plurality of groups to be used in parallel. For accomplishing the second object, a power line is laid for separating the subgroups of the group of bit lines from each other.

According to the second aspect of the present invention, bit lines are grouped into subgroups associated with ports by the power line. The power line works as a shield. Variations in potential on the bit lines due to accesses gained through different ports can be interrupted. Noise is therefore alleviated, and a malfunction can be prevented.

Furthermore, power wiring functioning as a shield should preferably be laid at least on or under a read data line.

The configuration according to the second aspect can be adapted to age semiconductor memory of the first embodiment.

In a semiconductor memory according to the third aspect of the present invention, for accomplishing the second object, each memory cell is composed of ferroelectric capacitors and NMOSFETs.

According to the third aspect of the present invention, each memory cell includes ferroelectric capacitors. Even when the power supply is turned off, stored data is maintained. Thus, a non-volatile memory can be realized. It is already known that a non-volatile memory can be realized by including ferroelectric capacitors in each memory cell. However, it has not been revealed that a non-volatile multiport memory can be realized by including ferroelectric capacitors in each memory cell.

The configurations of the present invention can be adapted to any multiport memory. For a memory having a plurality of ports, a group of bit lines divided into a plurality of subgroups associated with the plurality of ports is provided.

Each memory cell is provided with one or two ferroelectric capacitors. When each memory cell is provided with one ferroelectric capacitor, the memory cell is composed of at least two NMOSFETs. When each memory cell is provided with two ferroelectric capacitors, the memory cell is composed of at least four NMOSFETs. When an inverter is used as a sense amplifier, a high operating speed is possible but it becomes hard to maintain high precision. In this case, a reference cell having the same configuration as each memory cell is included, and the reference potential at the reference cell is compared with the potential at each memory cell.

BRIEF DESCRIPTION OF THE DRAWINGS

The present invention will be more clearly understood from the description as set below wit, reference to the accompanying drawings, wherein.

DESCRIPTION OF THE PREFERRED EMBODIMENT

Before proceeding to a detailed description of the preferred embodiments, prior art multi-port memories will be described with reference to the accompanying drawings for a clearer understanding of the differences between the prior art and the present invention.

Figure 1:
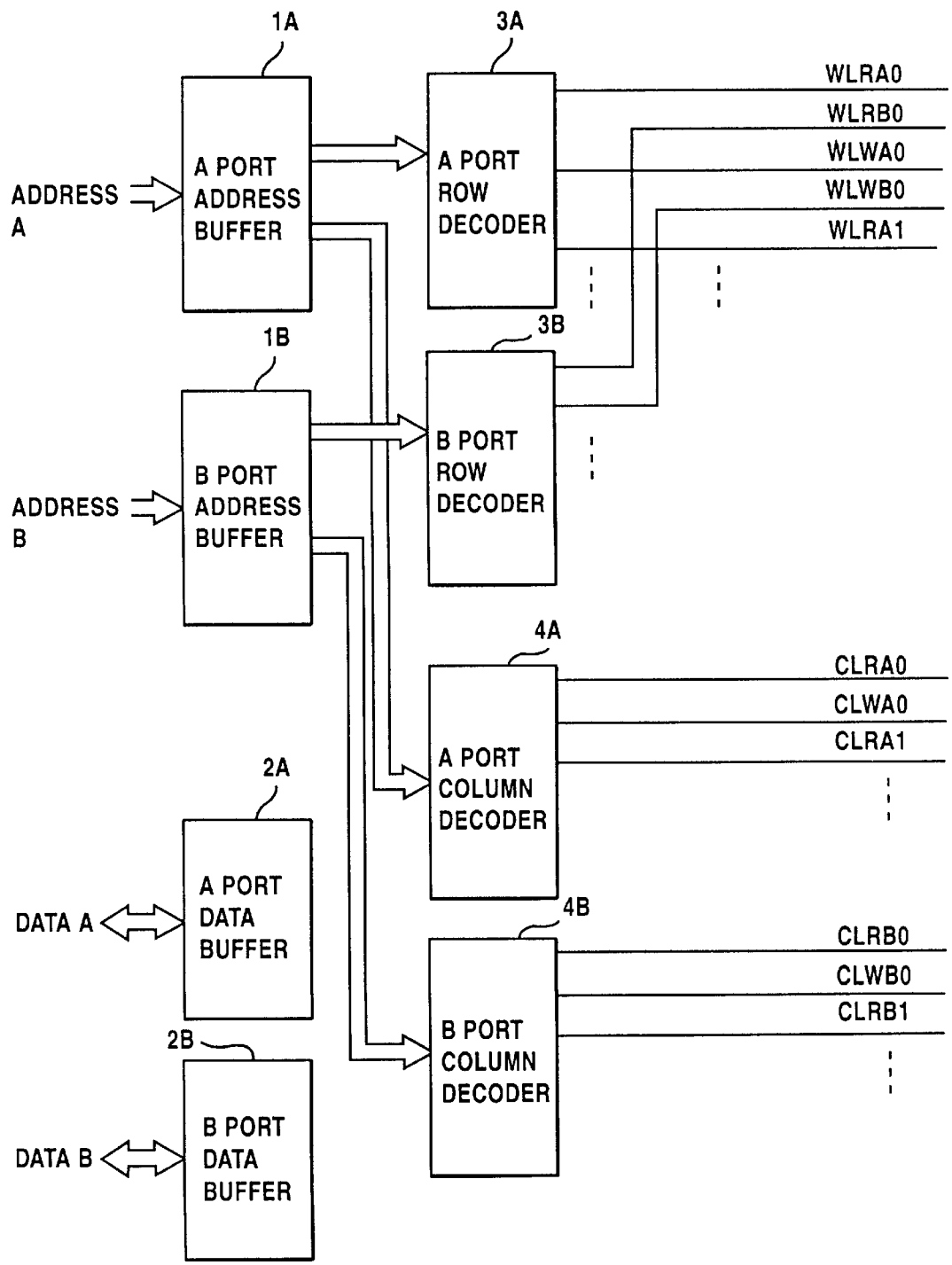
FIG. 1 is a block diagram showing a configuration of a decoder unit in a multiport memory.

FIG. 1 is a block diagram showing a configuration of a decoder unit in a conventional multiport memory. As shown in FIG. 1, address A indicating the position of a first memory cell is input to an A port address buffer 1A. Data to be written or read in or from the position of the first memory cell indicated with address A is input or output to or from an A port data buffer 2A. Likewise, address B indicating the position of a second memory cell is input to a B port address buffer 1B. Data to be written or read in or from the position of the second memory cell indicated with address B is input or output to or from a B port data buffer 2B. Data items input to the A and B port data buffers 2A and 2B during writing are supplied to write amplifiers, and data items read from memory cells through the sense amplifiers during reading are output from the A and B port data buffers 2A and 2B, though these data flows are not illustrated.

Address A input to the A port address buffer 1A has a portion thereof indicating a row including an access position supplied to an A port row decoder 3A, and a portion thereof indicating a column supplied to an A port column decoder 4A. Likewise, address B input to the B port address buffer 1B has a portion thereof indicating a row including an access position supplied to a B port row decoder 3B, and a portion thereof indicating a column supplied to a B port column decoder 4B. The A port row decoder 3A and B port row decoder 3B decode the supplied addresses and activate word lines on rows to be accessed. In this prior art, a control signal that is not shown indicates that access to a memory cell indicated with address A or B is intended for writing or reading. According to the instruction, the A port row decoder 3A and B port row decoder 3B each activate a word line used for reading or writing. The A port column decoder 4A and B port column decoder 4B decode the supplied addresses and activate write amplifiers or sense amplifiers associated with columns to be accessed. Whichever of a write amplifier and sense amplifier should be activated is indicated by the control signal.

Figure 2A:
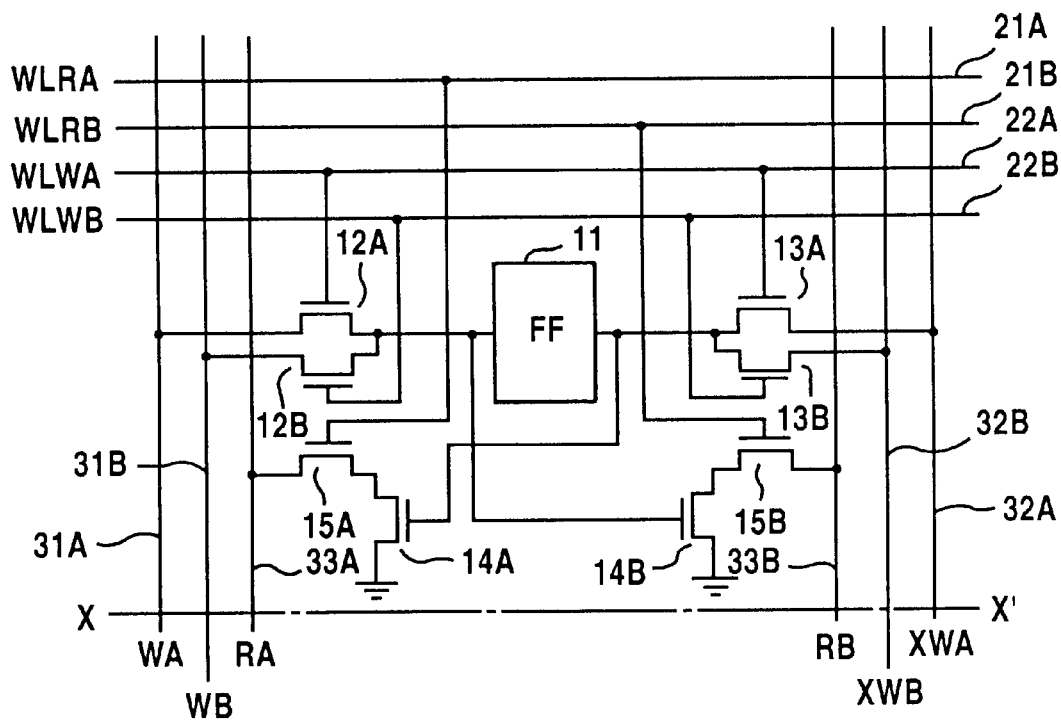
FIGS. 2A and 2B are diagrams showing a configuration of a memory cell in a conventional multiport memory and a layout of word lines and bit lines.
Figure 2B:
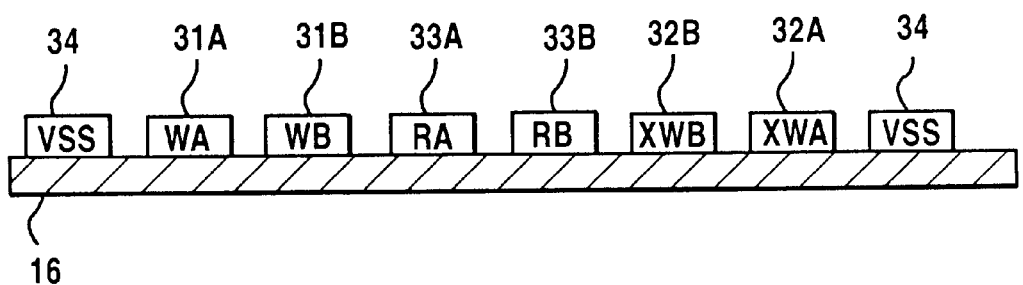

FIGS. 2A and 2B are diagrams showing the configuration and wiring of a memory cell in the conventional multiport memory. Each memory cell includes as memory elements a flip-flop (FF) 11 and a plurality of NMOSFETs 12A to 15A and 12B to 15B. A memory cell portion has such memory cells set in an array. The transverse direction in the array shall be referred to as the direction of a row, and the longitudinal direction therein shall be referred to as the direction of a column. A group of word lines are laid for each row, and a group of bit lines are laid for each column. As shown in FIG. 2A, each row is provided with four word lines, that is, a word line (WLRA) 21A used to read data from a memory cell in response to read access gained through an A port, a word line (WLRB) 21B used to read data in response to read access gained through a B port, a word line (WLWA) 22A used to write data in response to write access gained through the A port, and a word line (WLWB) 22B used to write data in response to write access gained through the B port. Each column is provided with six bit lines, that is, a read data line (RA) 33A used to output data read from the memory cell in response to read access gained through the A port, a read data line (3R) 33B used to output read data in response to read access gained through the B port, complementary write data lines (WA and XWA) 31A and 32A to be brought to states proportional to written data in response to write access gained through the A port, and complementary write data lines (WB and XWB) 31B and 32B to be brought to states proportional to written data in response to write access gained through the B port.

The FF 11 can assume two states. When one of the terminals of the FF is high, the other terminal is low. The two states are associated with two logical values. For writing data in a memory cell responsively to write access gained through the A port, after an associated write amplifier is used to bring the write data lines 31A and 32B to states proportional to written data, for example, to bring the write data line 3A to a high-level state and the write data line 32A to a low-level state, the word line 22A is activated. The NMOSFETs 12A and 13A are then turned on. This brings the FF in the memory cell 11 to a state proportional to the written data.

For reading data from the memory cell 11 responsively to read access gained through the A port, the word line 21A is activated. The NMOSFETs 15A is then turned on. The NMOSFET 14A is turned on or off according to the state of the FF 11 in the memory cell storing data. If the NMOSFET 14A is turned on, the read data line 33A is grounded and driven low. If the NMOSFET 14A is turned off, the read data line 33A is retained at an intermediate level. The difference in voltage level is detected by a sense amplifier.

It is hard to improve the driving abilities of the NMOSFETs 14A and 15A provided for each memory cell. There is a difficulty in increasing a difference in potential of the read data line 33A dependent on stored data for a short period of time. When read access is gained, therefore, if the potential on the read data line 33A varies a little, the sense amplifier amplities the potential.

The same applies to writing or reading of data in or from toe memory cell 11 in response to access gained through the B port. However, complementary signals produced using an output of the FF 11 in the memory cell are applied to the NMOSFETs 14A and 14B. Data items read onto the read data lines 33A and 333 are mutually opposite in polarity. After sense amplification is completed, one of the data items is reversed in order to match the polarities of the data items. This matching is intended to balance loads, connected to the FF 11 in the memory cell.

According to the prior art, two ports are associated with addresses A and B, and sets of word lines and bit lines used for reading and writing are provided for each of addresses A and B. Writing and reading of data can be carried out independently in parallel through the A and B ports. For example, reading or/and writing can be performed in parallel on two memory cells on the same row or column. However, it is impossible to access the same memory cell concurrently.

FIG. 2B is a diagram showing a layout in a bit line layer on an X–X' plane of the memory cell portion shown in FIG. 2A. A word line layer is located on or under the bit line layer, and NMOSFETs constituting memory cells are formed under the word line layer. Reference numeral 16 denotes an insulating layer. As illustrated, VSS power lines 34 are laid on both sides of bit lines. Between the VSS power lines, the bit lines of the write data line (WA) 31A, write data line (WB) 31B, read data line (RA) 33A, read data line (RB) 33B, write data line (XWB) 32B, and write data line (XWA) 32A are arranged in that order. This arrangement is determined for easy layout.

In the layout shown in FIGS. 2A and 2B, a parasitic capacitance develops between adjoining bit lines. In recent years, the capacity of multiport memories has grown. The adverse effect of an increased capacitance of a parasitic capacitance cannot be ignored any longer. For example, assume that read access is gained to a memory cell on a certain column through the A port, and write access is gained to a memory cell on the same column through the B port concurrently. The access gained through the A port and the access gained through the port are mutually independent. A clock is produced separately between the accesses. The potential on the read data line (RA) 33A is likely to vary depending on data in the accessed memory cell. In this case, when the write access is gained through the B port, one of the potentials on the write data lines (WB) 31B and (XWB) 32B is driven high with a large magnitude and the other thereof is driven low with a large magnitude. The potential on the read data line (RA) 33A is affected adversely by a parasitic capacitance developed between the read data line and the adjacent write data lines (WB) 31B. As mentioned above, a small potential variation occurring on the read data line (RA) 33A is amplified by an associated sense amplifier. If the potential on the write data line (WB) 31B varies immediately previously, the direction of the potential variation on the read data line (RA) 33A may be reversed, that is, the potential variation on the read data line (RA) 33A may be amplified in a direction opposite to the direction of read data through amplification. This results in a malfunction in outputting incorrect data.

Moreover, while read access is gained to a memory cell on a certain column through the A port, when read access is gained to a memory cell on the same column through the B port, the potential on the read data line (RA) 33A varies depending on data in the accessed memory cell. When the potential has varied a little, it is amplified by an associated sense amplifier. While the word line (WLRA) 21A is active, the potential on the read data line (RA) 33A keeps varying depending on data. In the meantime, read access is gained through the B port. When the potential on the read data line (RB) 33B varies depending on stored data, the potential on the read data line (RB) 33B is adversely affected by a variation in potential on the adjacent read data line (RA) 33A. This may lead to a malfunction.

Assuming that the operating speed of a memory is slow and that, after the potential on a read data line has varied sufficiently due to reading of data from a memory cell, an associated sense amplifier is actuated for amplification, the adverse effect of an adjacent bit line (write data line or read data line) due to a parasitic capacitance is so small as cot to pose a problem. However, there is an increasing demand for a multiport memory offering a high operating speed or especially a high reading speed. To improve the operating speed, the adverse effect of the parasitic capacitance cannot be ignored any longer.

Moreover, the memory cell shown in FIGS. 2A and 2B includes a flip-flop (FF). This kind of memory cell is volatile, wherein stored data is deleted when the power supply is turned off. As for a multiport memory having memory cells accessible in parallel, a type offering a high operating speed and having a simple configuration is needed.

The first embodiment is an embodiment realized by implementing the present invention in the configuration of the prior art shown in FIGS. 2A and 2B.

Figure 3A:
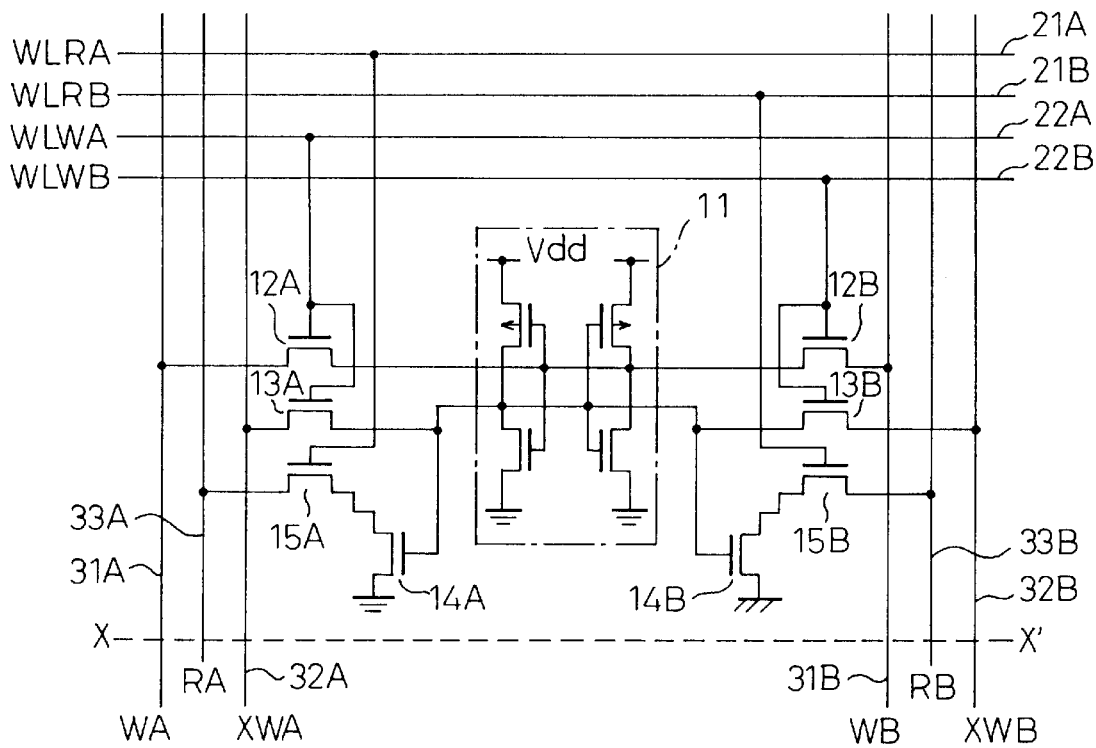
FIGS. 3A and 3B are diagrams showing a configuration of a memory cell in a multiport memory of the first embodiment and a layout of word lines and bit lines.
Figure 3B:
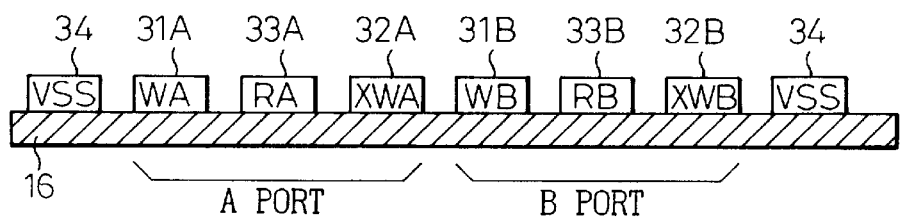

FIGS. 3A and 3B are diagrams showing a configuration of a multiport memory of the first embodiment of the present invention. FIG. 3A shows the circuitry of each memory, and FIG. 3B shows a layout of bit lines on an X–X' plane of the memory cell. Moreover, FIG. 4 is a diagram showing configurations of a write amplifier 7 and sense amplifier 8 in the first embodiment.

As shown in FIGS. 3A and 3B, a memory cell comprises a flip-flop (FF) 11 of a CMOS structure, and a plurality of NMOSFETs 12A to 15A and 12B to 15B. Moreover, as shown in FIG. 4, the write amplifier 7 includes drive units 71A, 71B, 72A, and 72B linked to write data lines 31A, 31B, 32A, and 32B, and inverters 73 for reversing signals to be applied to the drive units 71A and 71B and applying resultant signals to amplification units 72A and 72B. The drive unit 71A has the illustrated circuitry. For driving the potential on the write data line 31A high, a signal for turning on a PMOSFET 711 and turning off an NMOSFET 712 is applied to the drive unit 71A. For driving the potential on the write data line 31A low, a signal for turning off the PMOSFET 711 and turning on the NMOSFET 712 is applied thereto. When an associated column is unselected, a signal for turning off both the PMOSFET 711 and NMOSFET 712 is applied thereto.

When write access is gained through the A port, a write amplifier drive signal is produced according to a column selection signal output from an A port column decoder 4A and written data output from an A port data buffer 2A. The write amplifier drive signal is applied to the drive unit 71A associated with a column concerned and to the drive unit 72A via the inverter 73. Consequently, complementary signals proportional to the written data are applied to the complementary write data lines 31A and 32A for the A port. As for a row address, as described in conjunction with FIG. 3A, a row selection signal is applied from an A port row decoder to the word line (WLWA) 22A on the row concerned. Writing is then performed on a memory cell linked to the selected word line (WLWA) 22A and the selected complementary write data lines 31A and 32A. The same applies to write access to be gained through the B port.

Figure 4:
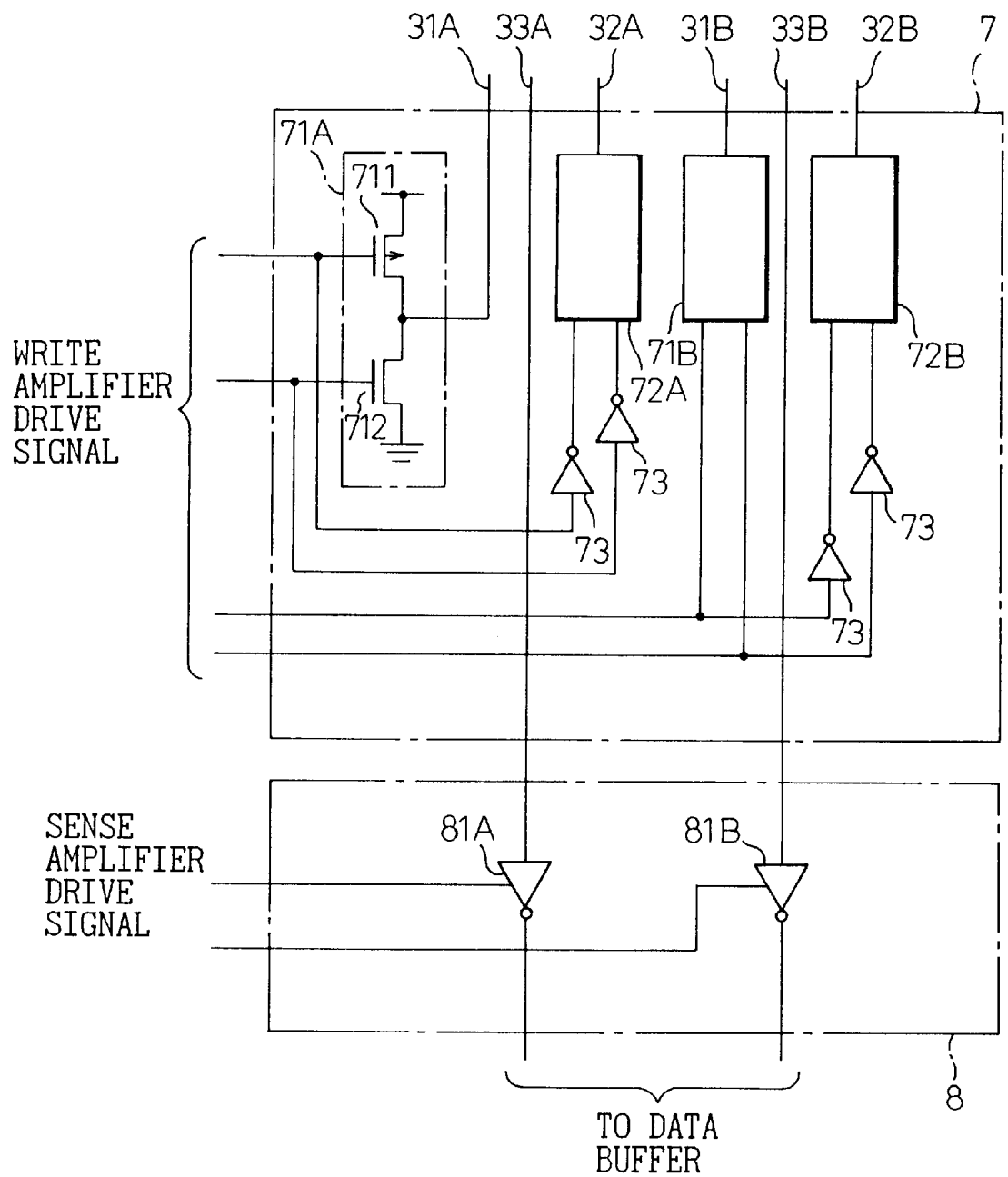
FIG. 4 is a diagram showing configurations of a write amplifier and sense amplifier in the multiport memory of the first embodiment.

As shown in FIG. 4, the sense amplifier 8 includes single-read type sense amplifiers 81A and 81B linked to the read data Lines 33A and 33B. The sense amplifiers 81A and 81B are activated selectively by a sense amplifier drive signal. When read access is gained through the A port, a row address is specified as described in conjunction with FIG. 3A, that is, a row selection signal is applied from the A tort row decoder to the word line (WLRA) 21A on a row concerned. This causes the potentials on all the read data lines 33A to start making transitions to states proportional to data items stored in memory cells on the accessed row. After a given time has elapsed, when the potentials on the read data lines 33A have varied to some extent, the sense amplifier 81A associated with a column selected with a sense amplifier drive signal is activated. The state of the read data line 33A linked to the sense amplifier 81A, that is, stored data is output from the sense amplifier 81A. The same applies to read access to be gained through the B port.

The foregoing configuration is identical to the one of the prior art. The multiport memory of the first embodiment is different from the one of the prior art shown in FIGS. 2A and 3B in the point that, as illustrated, VSS power lines 34 are arranged on both sides of bit lines and the bit lines of the write data line (WA) 31A, read data line (RA) 33A, write data line (XWA) 32A, write data line (WB) 31B, read data line (RB) 33B, and write data line (XWB) 32B are arranged in that order between the VSS power lines 34.

In the first embodiment, as shown in FIGS. 3A and 3B, the read data line 33A is sandwiched between the write data lines 31A and 32A, and the read data line 33B is sandwiched between the write data lines 31B and 32B. For reading data through the A port, no signal is applied to the write data lines 31A and 32A. It will therefore not take place that when the potential on the read data line 33A varies depending on data stored in an associated memory cell, the potentials on the write data lines 31A and 32A vary and the variation adversely affects the potential on the read data line 33A due to a parasitic capacitance formed between the write data lines 31A and 32A. The same applies to the read data line 33B.

A parasitic capacitance develops between the write data line 31B, read data line 33B, and write data line 32B, which constitute a group of bit lines for the B port, and the read data line 33A. However, since the group of bit lines for the B port is not adjacent to the read data line 33A, the value of the parasitic capacitance is small. Consequently, when the potential on the read data line 33A varies depending on data stored in an associated memory cell, even if the potentials on the group of bit lines for the B port vary greatly, the adverse effect is so small as not to pose a problem. The adverse effect of a great variation in potential on one read data line upon the other read data line due to a parasitic capacitance formed between the read data lines 33A and 33B, which poses a problem in the prior art described in conjunction with FIGS. 2A and 2B, is minimized to such an extent that no problem occurs.

As mentioned above, according to the layout of bit lines in the first embodiment, when the potential on one read data line varies greatly depending on data stored in an associated memory, an adverse effect of the other read data line is minimized. A malfunction will therefore not occur.

In the configuration of the first embodiment, if a power line is laid on or/and under the read data lines 33A and 33B as described later, the value of a parasitic capacitance formed between the read data line and the other group of bit lines not adjacent to the read data line is minimized. Noise derived from variations in potential on the other group of bit lines can be further alleviated.

Figure 5A:
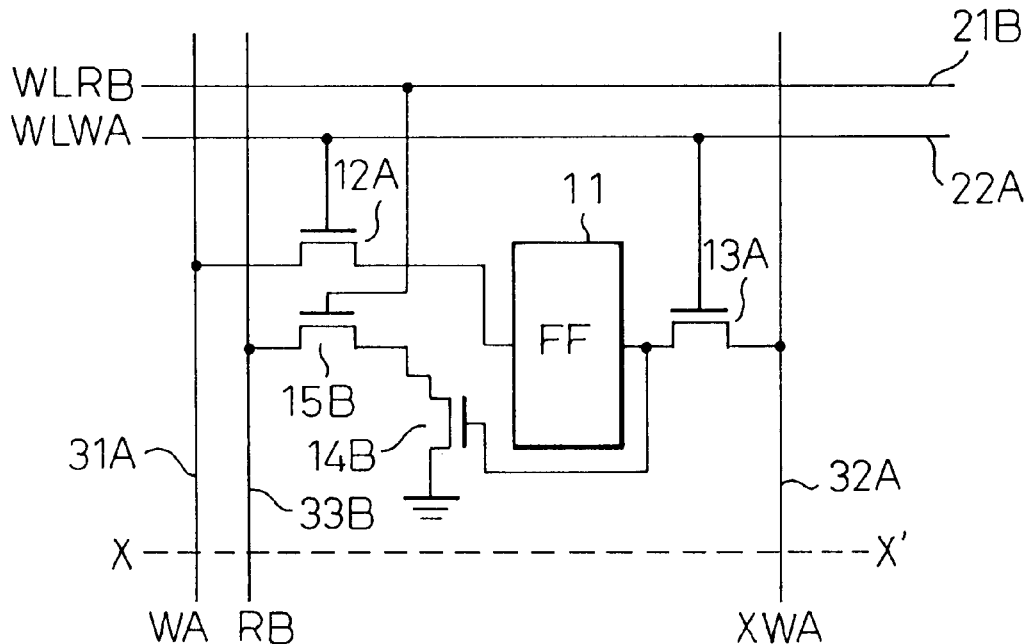
FIGS. 5A and 5B are diagrams showing a configuration of a memory cell in a multiport memory of the second embodiment and a layout of word lines and bit lines therein.
Figure 5B:
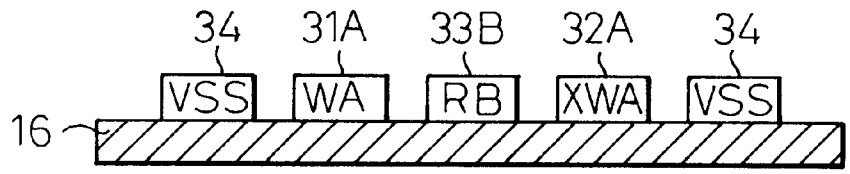

FIGS. 5A and 5B are diagrams snowing a configuration of a multiport memory of the second embodiment. FIG. 5A shows the circuitry of a memory cell portion, and FIG. 5B shows a layout in a bit line layer on an X–X' plane of the memory cell portion shown in FIG. 5A. The second embodiment is a multiport memory one of whose ports is used exclusively for writing and the other thereof is used exclusively for reading. The configuration of the second embodiment is a configuration realized by excluding the word lines 21A and 22B and the bit lines 33B, 32B, and 33A included in the first embodiment and laying the bit line 33B between the bit lines 31A and 32B.

Even in the second embodiment, the read data line 33B is sandwiched between the complementary write data lines 31A and 32A. The complementary, write data lines 31A and 32A work as shields so as to minimize the adverse effect of noises upon the read data line 33A. When different memory cells on the same column are accessed for writing and reading through two ports, the potentials on the complementary write data lines 31A and 32A vary simultaneously with reading of data from the memory cell onto the read data line 33B. However, since one of the potentials on the complementary write data lines is driven high and the other thereof is driven low, adverse effects upon the read data line are canceled out. Noise occurring on the read data line is small.

Figure 6:
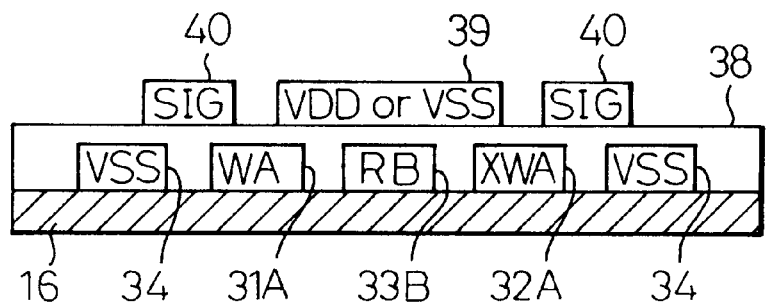
FIG. 6 is a diagram showing a layout of bit lines in a multiport memory of the third embodiment.

FIG. 6 is a diagram showing a layout of bit lines in a multiport memory of the third embodiment. This embodiment is such that a power line VDD or VSS is laid on the read data line 33B via an insulating layer 38 in the configuration of the second embodiment. Adverse effects of any other components, for example, signal lines 40 upon the read data line 33B, can be further minimized.

Figure 7A:
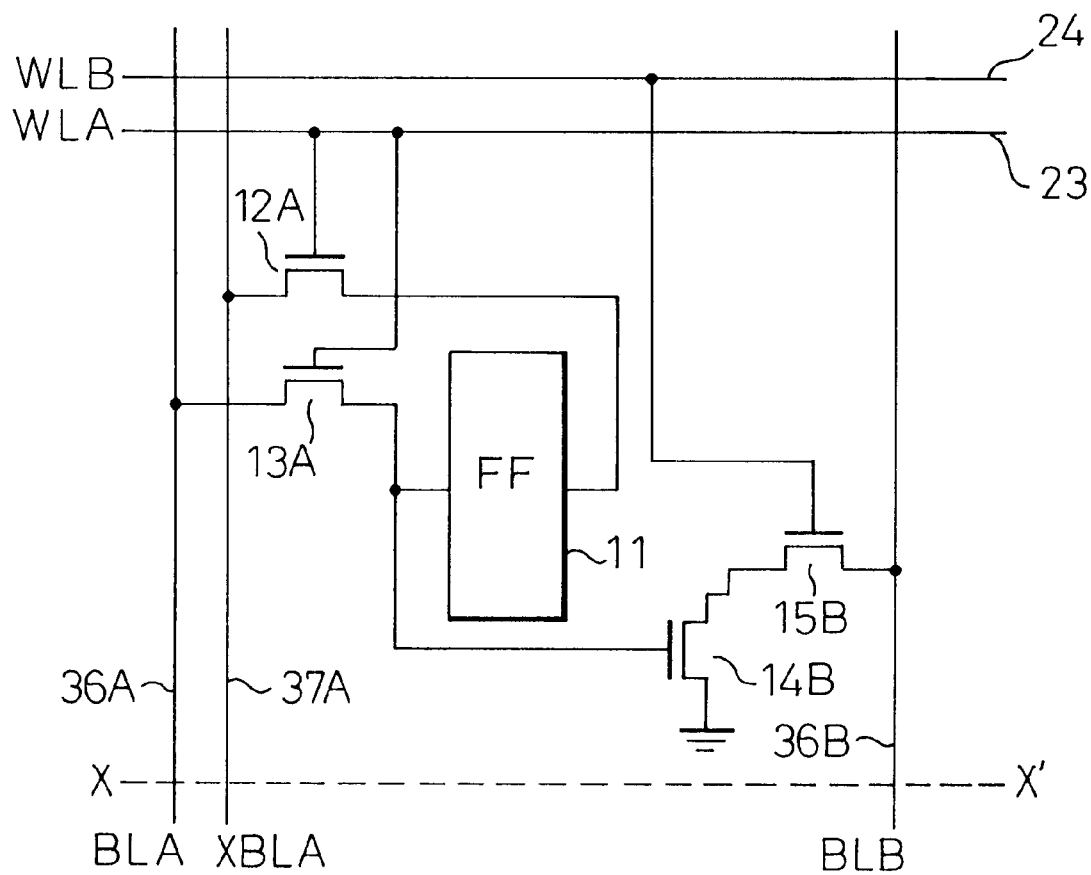
FIGS. 7A and 7B are diagrams showing a configuration of a memory cell in a multiport memory of the fourth embodiment and a layout of word lines and bit lines therein.
Figure 7B:
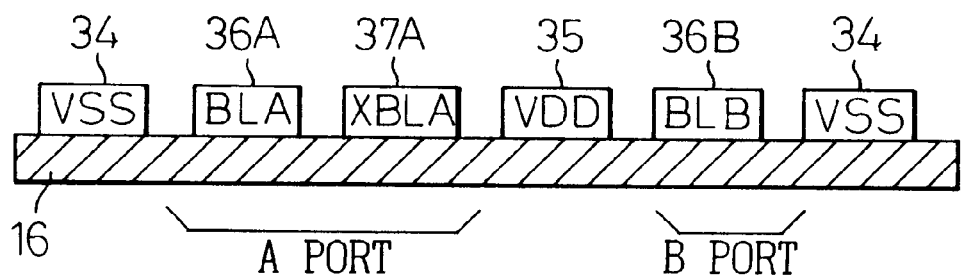

FIGS. 7A and 7B are diagrams showing a configuration of a multiport memory of the fourth embodiment. FIG. 7A shows the circuitry of a memory cell portion, and FIG. 7B shows a layout in a bit line layer on an X–X' plane of the memory cell portion shown in FIG. 7A. The fourth embodiment is a multiport memory whose A port is used for writing and reading and whose B port is used exclusively for reading. Access to be gained through the A port is effected by activating the word line (WLA) 23 and turning on the NMOSFETs 12A and 13A. For writing, an associated write amplifier is actuated in order to bring read/write data lines 36A and 37A, which are mutually complementary, to states proportional to written data. During reading, the potentials on the read/write data lines 36A and 37A vary to produce a potential difference according to the state of the memory cell 11 storing data. The potential difference is intensified through amplification by a sense amplifier 81 of a complementary push-pull type like the one shown in FIG. 8. The complementary push-pull sense amplifier 81 is already known. The description of the complementary push-pull amplifier will be omitted. Access to be gained through the B port is effected by activating the word line (WLB) 24 and turning on the NMOSFET 15B. As in the first embodiment, an output is provided via a single-read type sense amplifier 81B.

A difference of the configuration of the fourth embodiment from the one of the prior art lies in the point that, as shown in FIGS. 17A and 7B, in the bit line layer, the read/write data lines 36A and 37A for the A port are juxtaposed, the power line VDD 35 is laid between the read/write data lines and the read data line 36B for the B port; and the power lines VSS 34 are laid on both sides of these bit lines.

According to the layout of bit lines in the fourth embodiment shown in FIGS. 7A and 7B, the read/write data lines 36A and 37A for the A port and the read data line 36B for the B port are shielded by the power line VDD 35. When access is gained through one port, or especially, when read access is gained through one port, even if the potential on the read/write data line for the other port varies, the adverse effect of noise derived from the variation is minimized.

Figure 9A:
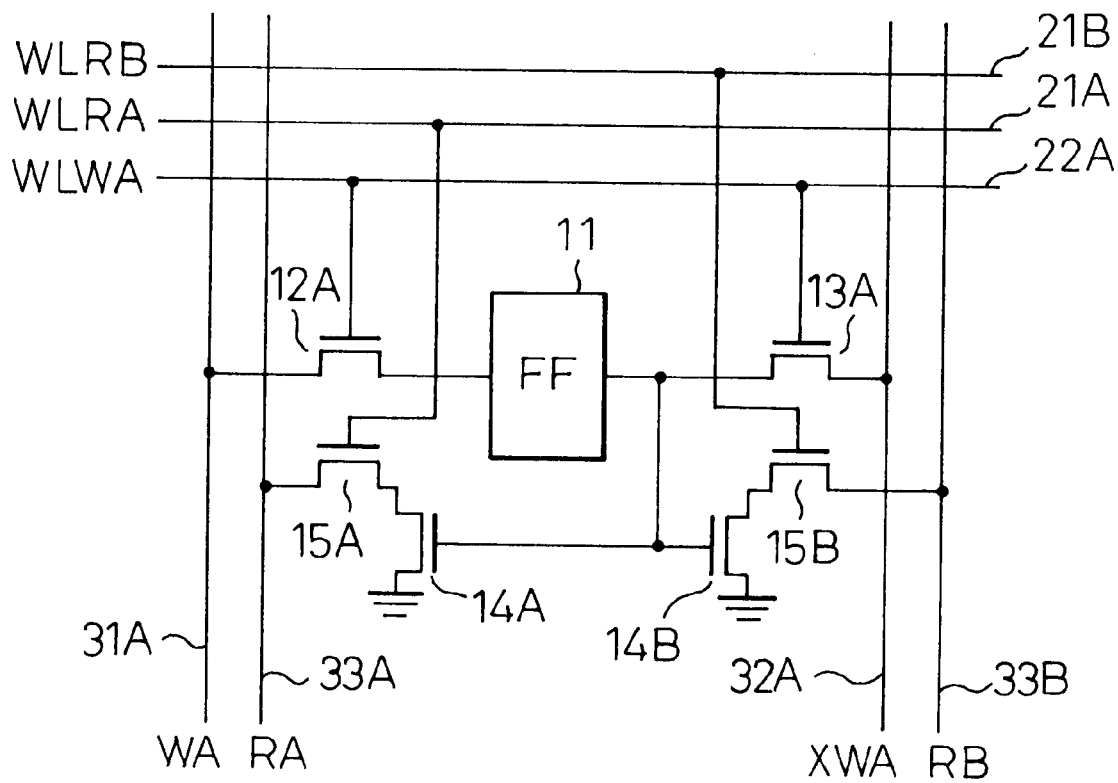
FIGS. 9A and 9B are diagrams showing a configuration of a memory cell in a multiport memory of the fifth embodiment and a layout of word lines and bit lines therein.
Figure 9B:
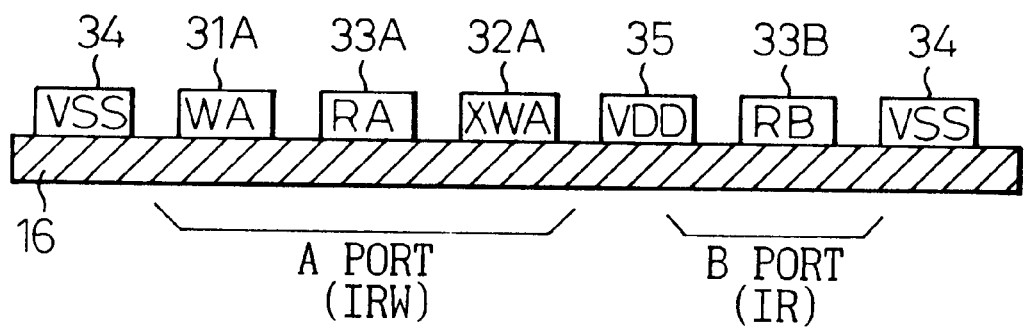

FIGS. 9A and 9B are diagrams showing a configuration of a multiport memory of the fifth embodiment. FIG. 9A shows the circuitry of a memory cell portion and FIG. 9B shows a layout of bit lines. The fifth embodiment is a multiport memory whose A port is used for writing and reading and whose B port is used exclusively for reading. Write access or read access to be gained through the A port is effected by utilizing another word line and other bit lines. The configuration of the fifth embodiment is equivalent to a configuration realized by excluding the word line and complementary bit lines used to write data through the B port from the configuration of the first embodiment.

In the fifth embodiment, as illustrated, the complementary write data lines 31A and 32A for the port and the read data line 33A are juxtaposed on the left-hand side and the read data line 33B for the B port is laid on the right-hand side. The power line VDD 35 is, like the one in the fourth embodiment, laid between the group of the write data lines 31A and 32A and read data line 33A for the A port, and the read data line 33B for the B port. On the left-hand side, the complementary write data lines 31A and 32A are arranged to sandwich the read data line 33A. Owing to this layout, the advantages described in conjunction with the first embodiment and fourth embodiment are exerted. In the fifth embodiment, the NMOSFETs 14A and 14B used for reading are connected to the same terminal of the FF 11 of the memory cell. This connection somewhat unbalances the loads on the FF 11. However, there is no particular problem in terms of operation. Data items of the same polarity are read onto the read data lines 33A and 33B.

Figure 10A:
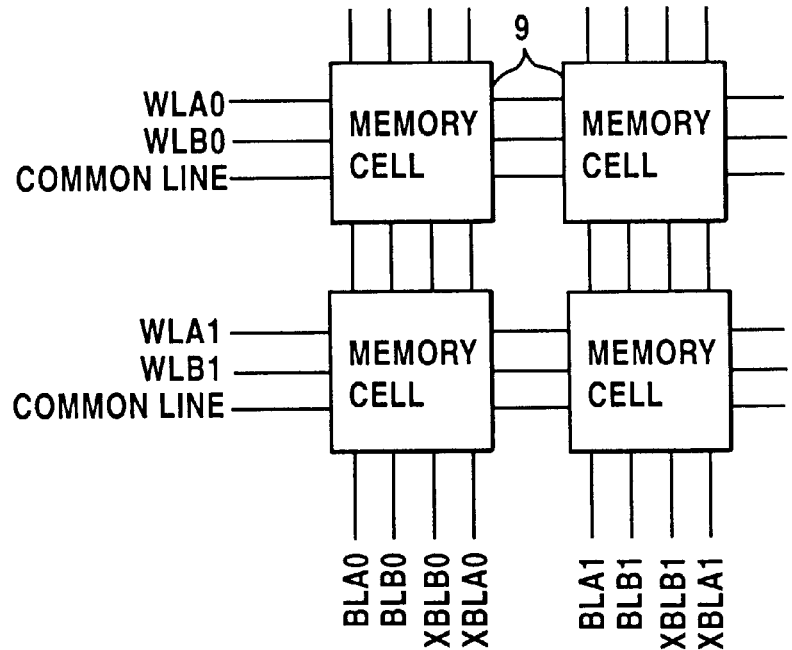
FIGS. 10A and 10B are diagrams showing a layout and configuration of memory cells in a multiport memory of the sixth embodiment and a layout of word lines and bit lines therein.
Figure 10B:
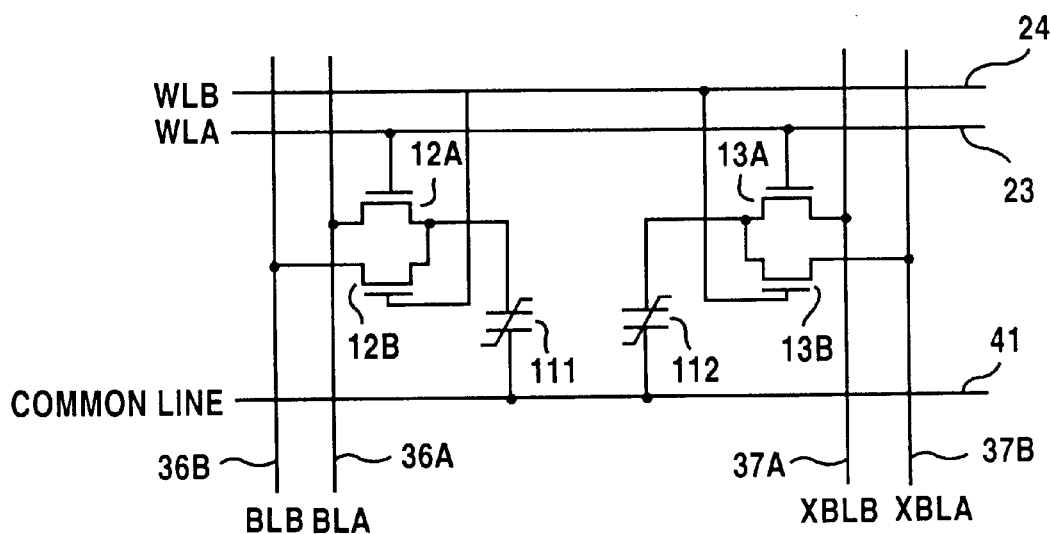

FIGS. 10A and 10B are diagrams showing a configuration of a multiport memory of the sixth embodiment. FIG. 10A shows a layout of memory cells and a layout of word lines and bit lines, and FIG. 10B shows a configuration of a memory cell portion.

As shown in FIG. 10A, in addition to the word lines and bit lines included in the conventional multiport memory, common lines having a given intermediate potential are laid. As shown in FIG. 10B, each memory cell includes as memory elements two capacitors and 111 and 112, made of a ferroelectric material, connected in series with each other, and linked to a node on the common line 41. When a voltage is applied to the capacitors, the capacitors are polarized. Even when the application of the voltage is stopped, the polarization is retained. Thus, the memory elements operate as non-volatile memory elements.

For writing data by utilizing the A port, a row selection signal is applied to the word line (WLA) 23 and the NMOSFETs 12A and 13A are turned on. In this state, an associated write amplifier is actuated in order to drive one of the potentials on the complementary read/write data lines (BLA and XBLA) 36A and 37A to high and the other thereof to low. Voltages are then applied to the capacitors 111 and 112, and held across the capacitors 111 and 112. For reading, likewise, the row selection signal is applied to the word line 23 and the NMOSFETs 12A and 13A are turned on. This causes the capacitors 111 and 112 to be linked to the complementary read/write data lines 36A and 37A. Consequently, voltages proportional to the magnitudes of charges held in the capacitors 111 and 112 are generated or the complementary read/write data lines 35A and 37A. The voltages are amplified by the complementary push-pull sense amplifier shown in FIG. 8 and then output. Thus, stored data is read. The same applies to access to be gained by utilizing the B port. The access to be gained by utilizing the B port can be effected in parallel with access to be gained by utilizing the A port.

However, in the multiport memory of the sixth embodiment, during reading, voltages are generated on the complementary read/write data lines 36A and 37A according to the magnitudes of charges held in the capacitors 111 and 112. To prevent a malfunction from occurring during amplification by a sense amplifier, the voltages generated on the complementary read/write data lines 36A and 37A must be large enough. In particular, to each evening high-speed reading, voltages equal to or larger than a given magnitude must be generated on the complementary read/write data lines 36A and 37A for a short period of time. This poses a problem when the reading speed is high. The seventh embodiment, to be described below, attempts to solve this problem.

Figure 8:
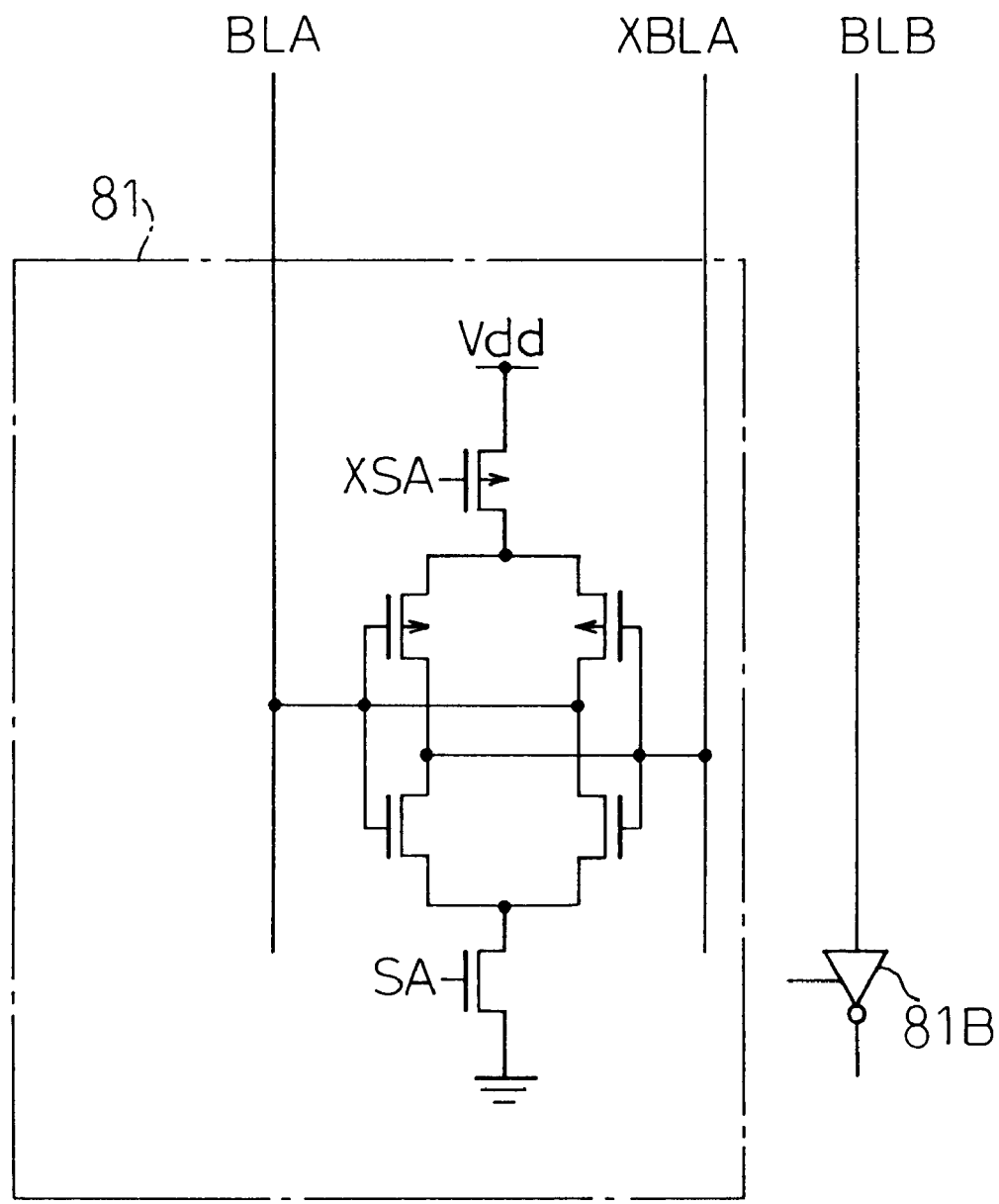
FIG. 8 is a diagram showing a configuration of a sense amplifier in the multiport memory of the fourth embodiment.
Figure 11:
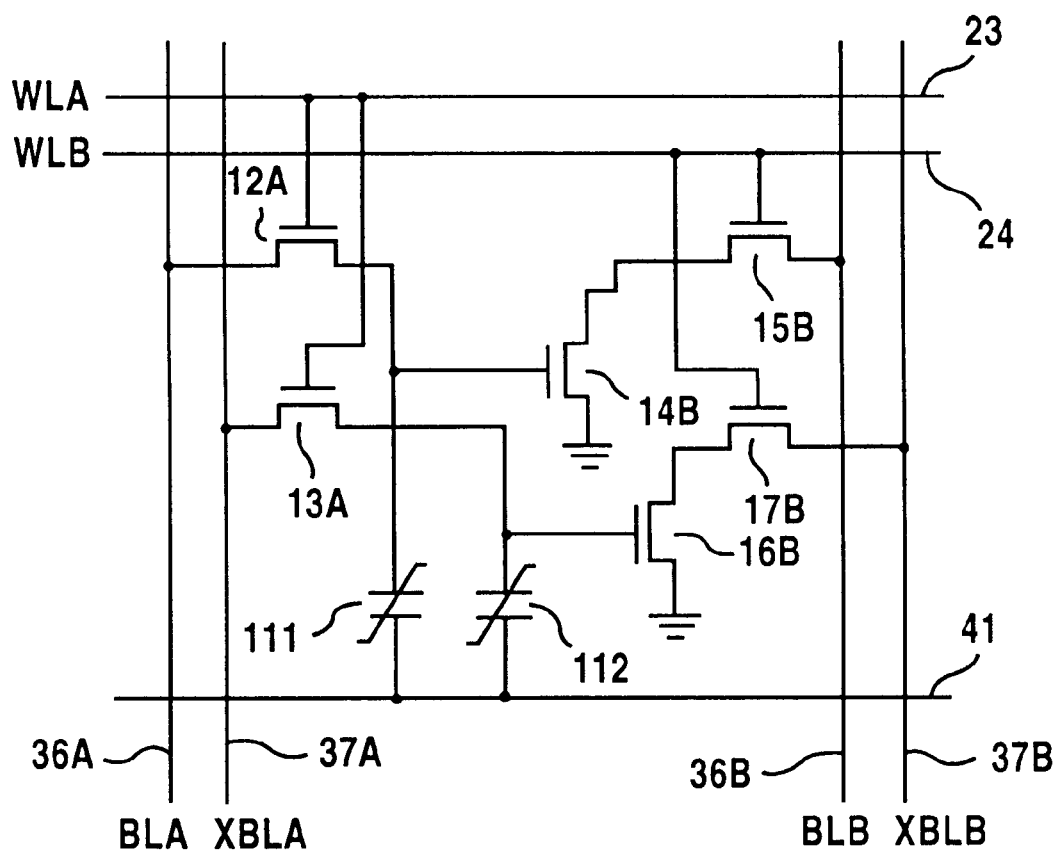
FIG. 11 is a diagram showing a configuration of a memory cell in a multiport memory of the seventh embodiment and a layout of word lines and bit lines therein.

FIG. 11 is a diagram showing a configuration of a multiport memory of the seventh embodiment, wherein a configuration of a memory cell portion and a layout of word lines and bit lines are shown. The multiport memory of the seventh embodiment is a multiport memory realized by substituting two ferroelectric capacitors 111 and 112 for the memory cell 11 in the multiport memory of the fourth embodiment shown in FIG. 7A. The A port is used for reading and writing and the B port is used exclusively for reading. The complementary push-pull sense amplifier shown in FIG. 8 is employed. The multiport memory of the seventh embodiment operates in the same manner as the multiport memory of the fourth embodiment except that the multiport memory of the seventh embodiment is a non-volatile memory whose stored data is maintained even after the power supply is turned off. In the multiport memory of the seventh embodiment, it is the NMOSFETs 14B and 16B that generate voltages on the complementary read/write data lines 36A and 37A. Voltages held in the capacitors 111 and 112 are used to drive the NMOSFETs 14B and 16B. Large currents are not needed. The capacitances of the capacitors 111 and 112 may therefore be small. This leads to a small memory cell. Consequently, high-density integration of components can be achieved.

In the multiport memories of the sixth and seventh embodiments shown in FIGS. 10A and 10B and FIG. 11, two capacitors made of a ferroelectric material are employed, complementary read/write data lines are laid, and a complementary push-pull sense amplifier is adopted. Semiconductor memories are required to realize higher-density integration of components. The eighth and ninth embodiments to be described below are realized by integrating components of the multiport memories of the sixth and seventh embodiments at a high density.

Figure 12A:
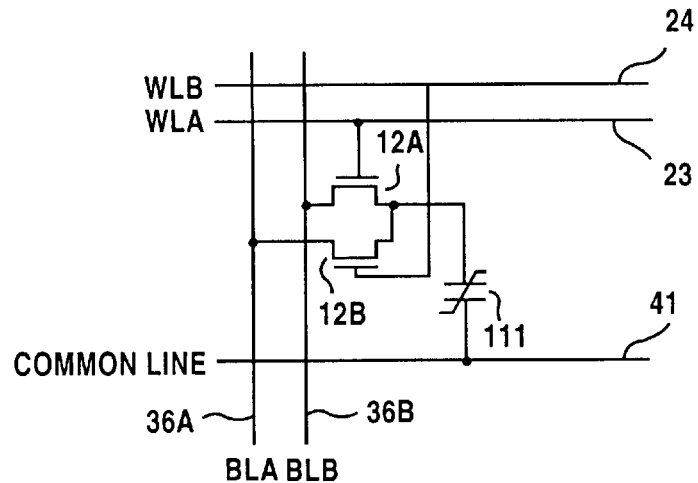
FIGS. 12A and 12B are diagrams showing a layout and configuration of memory cells in a multiport memory of the eighth embodiment and a layout of word lines and bit lines therein.
Figure 12B:
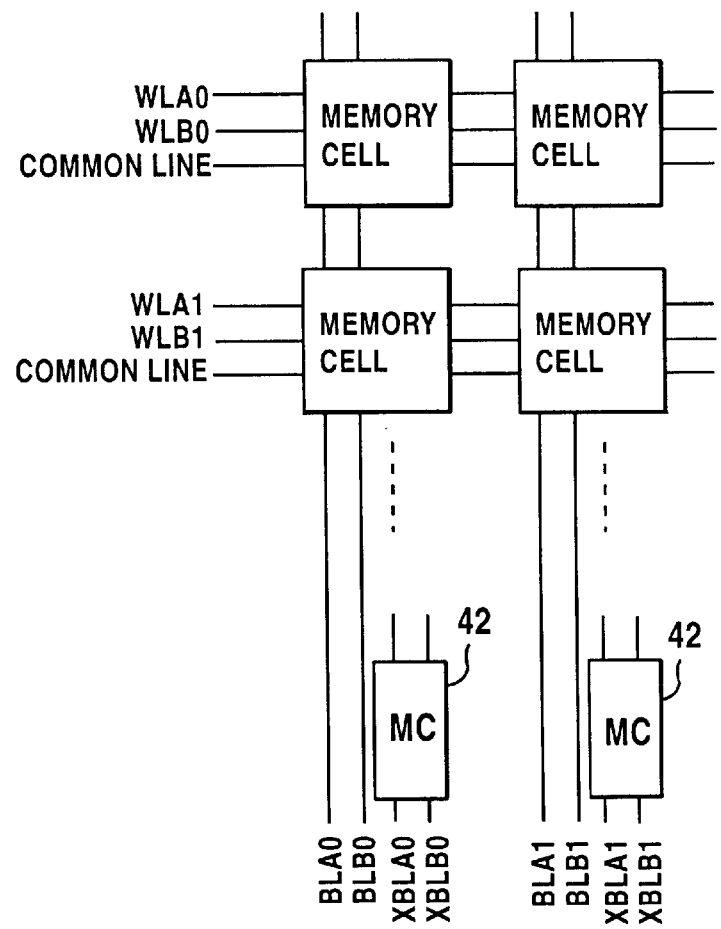

FIGS. 12A and 123 are diagrams showing a configuration of a multiport memory of the eighth embodiment. FIG. 12A shows a configuration of a memory cell portion, and FIG. 12B shows a layout of memory cells and a layout of word lines and bit lines.

As shown in FIG. 12A, the multiport memory of the eighth embodiment is realized by excluding the capacitor 112, NMOSFETs 13A and 13B, and complementary read/write data lines 37A and 37B, which are a pain of complementary read/write data lines, from the multiport memory of the sixth embodiment: shown in FIG. 10B. The operation of the multiport memory of the eighth embodiment is nearly identical to that of the multiport memory of the sixth embodiment. However, the read/write data lines are not mutually complementary. When a complementary push-pull sense amplifier is employed, as shown in FIG. 12B, a comparison memory cell 42 having the same configuration as each memory cell is included for each column. A reference voltage output from the comparison memory cell 42 and a potential difference between the read/write data lines 36A and 36B are amplified. Moreover, a single-read type sense amplifier like the one shown in FIG. 4 is employed.

Figure 13:
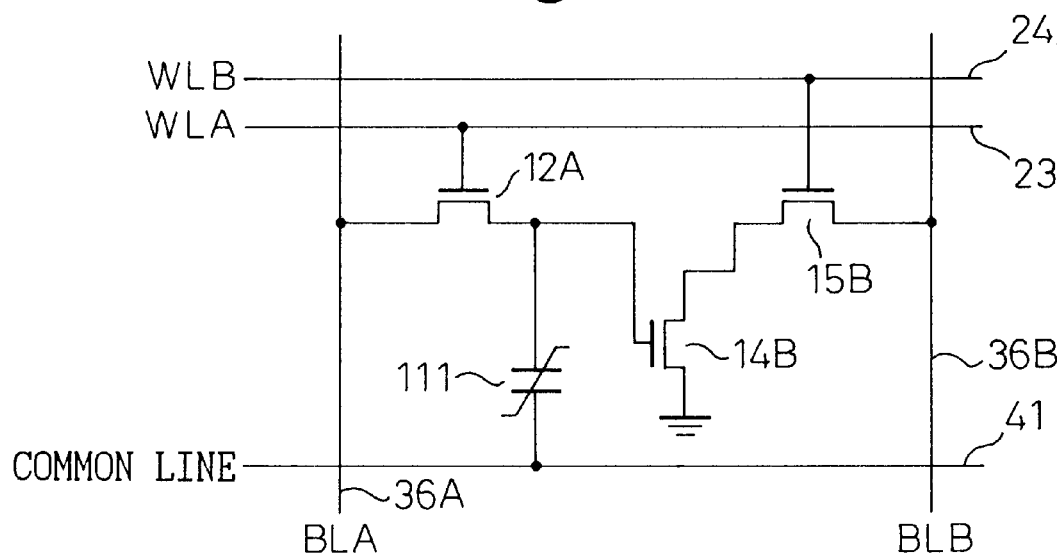
FIG. 13 is a diagram showing a configuration of a memory cell in a multiport memory of the ninth embodiment and a layout of word lines and bit lines.

FIG. 13 is a diagram showing a configuration of a memory cell portion of a multiport memory of the ninth embodiment, and a layout of word lines and bit lines. The multiport memory of the ninth embodiment is realized by excluding the capacitor 112, NMOSFETs 13A, 16B, and 17B, and complementary read/write data lines 37A and 37B, which are a pair of complementary read/write data lines, from the multiport memory of the seventh embodiment shown in FIG. 11. Thus, high-density integration of components is achieved. A further description will be omitted.

The embodiments of the present invention have been described by taking several multiport memories as examples. Another types of multiport memories are available. The present invention can be implemented n these multiport memories. Moreover, various configurations are conceivable for the multiport memories. The present invention can also be implemented in these configurations.

As described above, according to the present invention, the adverse effect of noise upon a read data line curing reading is minimized. A malfunction will therefore not occur during amplification by a sense amplifier. This leads to the improved reliability of semiconductor memories. Furthermore, since the adverse effect of noises upon a read data line during reading is minimized, immediately after reading is completed, amplification by a sense amplifier can be started. This results in the improved reading speed of semiconductor memories. Moreover, according to the present invention, a non-volatile multiport memory is realized.

What is claimed is:

1. A semiconductor memory, comprising:
   a memory cell array having a plurality of memory cells set in array; and
   a group of bit lines extending in the direction of a column within each memory cell in said memory cell array and including at least a set of complementary write data lines and a read data line,
   said complementary write data lines being arranged to sandwich said read data line.

2. A semiconductor memory according to claim 1, further comprising a plurality of ports through which different memory cells in said memory cell array are accessed in parallel, wherein said group of bit lines is subdivided into a plurality of groups associated with said plurality of ports.

3. A semiconductor memory according to claim 2, wherein one of said plurality of sorts is a groups port used exclusively for writing and the other thereof is a second port used exclusively for reading; and said group of bit lines includes complementary write data lines associated with said first port and a read data line associated with said second port, and said read data line associated with said second port is sandwiched between said complementary write data lines associated with said first port.

4. A semiconductor memory according to claim 2, wherein at least one of said plurality of groups includes complementary write data lines and a read data line sandwiched between said complementary write data lines.

5. A semiconductor memory according to claim 4, wherein one of said plurality of ports is a first port used for reading and writing and another one thereof is a second port used for reading and writing, and said group of bit lines is subdivided into a first group of bit lines for said first port including first complementary write data lines associated with said first port and a first read data line sandwiched between said first complementary write data lines, and a second group of bit lines for said second port including second complementary write data lines associated with said second port and a second read data line sandwiched between said second complementary write data lines.

6. A semiconductor memory according to claim 4, wherein one of said plurality of ports is a first port used for reading and writing and another one thereof is a second port used exclusively for reading, and said group of bit lines consists of a first group of bit lines for said first port including first complementary write data lines associated with said first port and a first read data line sandwiched between said first complementary write data lines, and a second read data line associated with said second port.

7. A semiconductor memory according to claim 2, further comprising a power line laid to separate said plurality of groups from each other.

8. A semiconductor memory according to claim 2, further comprising power wiring laid at least above or below said read data line.

9. A semiconductor memory, comprising:
   a memory cell array having a plurality of memory cells set in an array; and
   a group of bit lines extending in the direction of a column within each memory cell in said memory cell array and subdivided into a plurality of groups, said semiconductor memory further comprising power lines laid for separating said subgroups of said group of bit lines from one another.

10. A semiconductor memory according to claim 9, further comprising a plurality of ports through which different memory cells in said memory cell array are accessed in parallel, wherein said group of bit lines is subdivided into a plurality of groups associated with said plurality of ports, one of said plurality of ports is a first port used for reading and writing and another one thereof is a second port used exclusively for reading, said group of bit lines includes first complementary read/write data lines associated with said first port and a second read data line associated with said second port, and a power line is laid between said first complementary read/write data lines and said second read data line.

11. A semiconductor memory according to claim 9, further comprising power wiring laid at least above or below said read data line.

12. A semiconductor memory according to claim 1, wherein said memory cell includes ferroelectric capacitors and NMOSFETs.

13. A semiconductor memory according to claim 2, wherein said memory cell includes ferroelectric capacitors.

14. A semiconductor memory, comprising
a memory cell array having a plurality of memory cells set in array; and
a group of bit lines extending in the direction of a column within each memory cell in; said memory cell array, used for accessing different memory cells in said memory cell array in parallel, and subdivided into a plurality of groups,
said memory cell including ferroelectric capacitors and NMOSFETs,
wherein said group of bit lines subdivided into said plurality of groups includes two pairs of complementary read/write data lines, and said memory cell includes two ferroelectric capacitors connected in series with each other and four or more NMOSFETs.

15. A semiconductor memory, comprising:
a memory cell array having a plurality of memory cells set in array; and
a group of bit lines extending in the direction of a column within each memory cell in said memory cell array used for accessing different memory cells in said memory cell array in parallel, and subdivided into a plurality of groups,
said memory cell including ferroelectric capacitors and NMOSFETs,
wherein said group of bit lines subdivided into said plurality of groups includes one pair of complementary read/write data lines and one pair of complementary read-only data lines, and said memory cell includes two ferroelectric capacitors connected in series with each other and six or more NMOSFETs.

16. A semiconductor memory, comprising:
a memory cell array having a plurality of memory cells set in array; and
a group of bit lines extending in the direction of a column within each memory cell in said memory cell array, used for accessing different memory cells in said memory cell array in parallel, and subdivided into a plurality of groups,
said memory cell including ferroelectric capacitors and NMOSFETs,
wherein said group of bit lines subdivided into said plurality of groups includes two read/write data lines, said memory cell includes one ferroelectric capacitor and two or more NMOSFETs, and a reference call having the same configuration as said memory cell is included for outputting a reference signal to be compared with signals read from said memory cell onto said read/write data lines.

17. A semiconductor memory, comprising:
a memory cell array having a plurality of memory cells set in array; and
a group of bit lines extending in the direction of a column within each memory cell in said memory cell array, used for accessing different memory cells in said memory cell array in parallel, and subdivided into a plurality of groups,
said memory cell including ferroelectric capacitors and NMOSFETs,
wherein said group of bit lines subdivided into said plurality of groups includes one read/write data line and one read-only data line, said memory cell includes one ferroelectric capacitor and three or more NMOSFETs, and a reference cell having the same configuration as said memory cell is included for outputting a reference signal to be compared with a signal read from said memory cell onto said read/write data line or read-only data line.

* * * * *